(12) United States Patent
Teranishi et al.

(10) Patent No.: US 11,456,260 B2
(45) Date of Patent: Sep. 27, 2022

(54) WAFER PROCESSING METHOD

(71) Applicant: DISCO CORPORATION, Tokyo (JP)

(72) Inventors: Shunsuke Teranishi, Tokyo (JP);
 Shigefumi Okada, Tokyo (JP);
 Shuichiro Tsukiji, Tokyo (JP); Yuki Ikku, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/171,213

(22) Filed: Feb. 9, 2021

(65) Prior Publication Data

US 2021/0265279 A1 Aug. 26, 2021

(30) Foreign Application Priority Data

Feb. 21, 2020 (JP) .............................. JP2020-028751

(51) Int. Cl.
 *H01L 21/78* (2006.01)
 *H01L 21/66* (2006.01)
 *H01L 23/544* (2006.01)
 *H01L 21/268* (2006.01)

(52) U.S. Cl.
 CPC .......... *H01L 23/544* (2013.01); *H01L 21/268* (2013.01); *H01L 22/12* (2013.01); *H01L 2223/5446* (2013.01)

(58) Field of Classification Search
 CPC ............. H01L 51/0048; H01L 21/4853; H01L 21/486; H01L 23/49872; H01L 23/53276
 See application file for complete search history.

(56) References Cited

U.S. PATENT DOCUMENTS

| 2014/0106545 | A1* | 4/2014 | Okada | B23K 26/10 438/463 |
|---|---|---|---|---|
| 2017/0320165 | A1* | 11/2017 | Hyakumura | B23K 26/046 |
| 2019/0131193 | A1* | 5/2019 | Yang | B23K 26/03 |
| 2019/0382300 | A1* | 12/2019 | Bui | B23K 26/0652 |

FOREIGN PATENT DOCUMENTS

| JP | 2005086161 A | 3/2005 |
|---|---|---|
| JP | 2010068009 A | 3/2010 |

* cited by examiner

*Primary Examiner* — Brian Turner
(74) *Attorney, Agent, or Firm* — Greer Burns & Crain, Ltd.

(57) ABSTRACT

A wafer processing method for forming a modified layer within a wafer along planned dividing lines forms the modified layer within the wafer, positions a condensing point within the wafer or at a top surface of the wafer and applies a second laser beam while moving the condensing point, images reflected light, and determines a processed state of the wafer on the basis of an imaged image. The second laser beam is formed such that a sectional shape of the second laser beam in a plane perpendicular to a traveling direction of the second laser beam is not axisymmetric with respect to an axis along the planned dividing lines.

12 Claims, 12 Drawing Sheets

WAFER PROCESSING METHOD

BACKGROUND OF THE INVENTION

Field of the Invention

The present invention relates to a wafer processing method that forms a modified layer as a starting point for dividing a wafer by applying a laser beam from an undersurface side of the wafer and condensing the laser beam within the wafer, and makes a crack extend from the modified layer to a top surface side of the wafer.

Description of the Related Art

In a process of manufacturing device chips, a plurality of planned dividing lines intersecting each other are set on the top surface of the wafer, a device is formed in each of demarcated regions, and the wafer is divided along the planned dividing lines. For example, a laser beam having a wavelength transmissible through the wafer (wavelength that can pass through the wafer) is applied to the wafer from the undersurface side of the wafer and is condensed within the wafer along the planned dividing lines. At this time, a modified layer as a starting point for division is formed in the vicinity of the condensing point of the laser beam. When a crack extends from the formed modified layer to the top surface of the wafer, the wafer is divided along the planned dividing lines (see Japanese Patent Laid-Open No. 2005-86161 and Japanese Patent Laid-Open No. 2010-68009, for example). This processing method necessitates appropriate settings of processing conditions such as the formation position of the modified layer in the depth direction of the wafer, and the irradiation condition of the laser beam so that the modified layer is formed and the crack develops from the modified layer to the top surface of the wafer. When the processing conditions or the like are not appropriate, the crack does not appropriately extend from the formed modified layer, or the crack extends in an unintended direction, for example, so that the wafer cannot be divided appropriately. The yield of the device chips is therefore decreased. In addition, when the optical axis of an optical system is displaced, the modified layer is not formed at a predetermined position. Thus, again, the wafer cannot be divided appropriately.

SUMMARY OF THE INVENTION

Here, in order to check whether or not the processing conditions or the like are appropriate, the modified layer is formed as intended, and the crack is appropriately developed from the modified layer to the top surface of the wafer, the top surface of the wafer may be observed by a microscope or the like, for example. However, in order to observe the top surface side of the wafer irradiated with the laser beam from the undersurface side, it is necessary, for example, to extract the wafer from a laser processing apparatus, vertically invert the wafer, and carry the wafer into a microscope or the like. Therefore, there is a problem in that it takes man-hours to check a processed state of the wafer.

It is accordingly an object of the present invention to provide a wafer processing method that makes it possible to check easily whether or not a wafer is appropriately processed.

In accordance with an aspect of the present invention, there is provided a wafer processing method for forming a modified layer within a wafer along a plurality of planned dividing lines of the wafer, the wafer having the planned dividing lines set on a top surface of the wafer. The wafer processing method includes a holding step of making the top surface of the wafer face a chuck table, and holding the wafer by the chuck table, a modified layer forming step of forming the modified layer within the wafer by positioning a condensing point of a first laser beam having a wavelength transmissible through the wafer within the wafer and applying the first laser beam along the planned dividing lines from an undersurface side of the wafer while moving a laser beam irradiating unit and the chuck table relative to each other in a direction along the planned dividing lines, an observation laser beam applying step of, after the modified layer forming step, positioning a condensing point of a second laser beam having a power not exceeding a processing threshold value of the wafer and having a wavelength transmissible through the wafer within the wafer or at the top surface of the wafer, and applying the second laser beam from the undersurface side of the wafer while moving the wafer and the condensing point relative to each other in the direction along the planned dividing lines, an imaging step of imaging, by an imaging unit, reflected light of the second laser beam applied in the observation laser beam applying step, and a determining step of determining a processed state of the wafer on a basis of an image displayed in the imaging step. The second laser beam applied to the wafer in the observation laser beam applying step is formed such that a sectional shape of the second laser beam in a plane perpendicular to a traveling direction of the second laser beam is not axisymmetric with respect to an axis along the planned dividing lines.

In addition, according to another aspect of the present invention, there is provided a wafer processing method for forming a modified layer within a wafer along a plurality of planned dividing lines of the wafer, the wafer having the planned dividing lines set on a top surface of the wafer. The wafer processing method includes a holding step of making the top surface of the wafer face a chuck table, and holding the wafer by the chuck table, a modified layer forming step of forming the modified layer within the wafer by positioning a condensing point of a first laser beam having a wavelength transmissible through the wafer within the wafer and applying the first laser beam along the planned dividing lines from an undersurface side of the wafer while moving a laser beam irradiating unit and the chuck table relative to each other in a direction along the planned dividing lines, an observation laser beam applying step of, after the modified layer forming step, positioning a condensing point of a second laser beam having a power not exceeding a processing threshold value of the wafer and having a wavelength transmissible through the wafer within the wafer or at the top surface of the wafer, and applying the second laser beam from the undersurface side of the wafer while moving the wafer and the condensing point relative to each other in a direction orthogonal to the direction along the planned dividing lines such that the condensing point crosses the modified layer, an imaging step of imaging, by an imaging unit, reflected light of the second laser beam applied in the observation laser beam applying step, and a determining step of determining a processed state of the wafer on a basis of an image photographed in the imaging step. The second laser beam applied to the wafer in the observation laser beam applying step is formed such that a sectional shape of the second laser beam in a plane perpendicular to a traveling direction of the second laser beam is not axisymmetric with respect to an axis along the planned dividing lines.

Preferably, the observation laser beam applying step is performed in an immersed state.

The wafer processing method according to one aspect of the present invention performs the observation laser beam applying step, the imaging step, and the determining step after performing the modified layer forming step of forming the modified layer by condensing the first laser beam within the wafer. In the observation laser beam applying step, the second laser beam is applied from the undersurface side of the wafer while the wafer and the condensing point are moved relative to each other.

The second laser beam applied to the undersurface side of the wafer and traveling within the wafer in the observation laser beam applying step is reflected by the top surface of the wafer. Then, in the imaging step, an image is formed by imaging reflected light of the second laser beam. Here, the shape and position of the reflected light appearing in the image are determined by positional relations between the modified layer, the crack, and the second laser beam, and the like. Therefore, when images displaying the reflected light of the second laser beam are formed while the wafer and the condensing point are moved relative to each other, the processed state of the wafer such as the formation position and height of the modified layer, and the presence or absence of the crack can be determined.

Hence, one aspect of the present invention provides a wafer processing method that makes it possible to check easily whether or not a wafer is processed appropriately.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
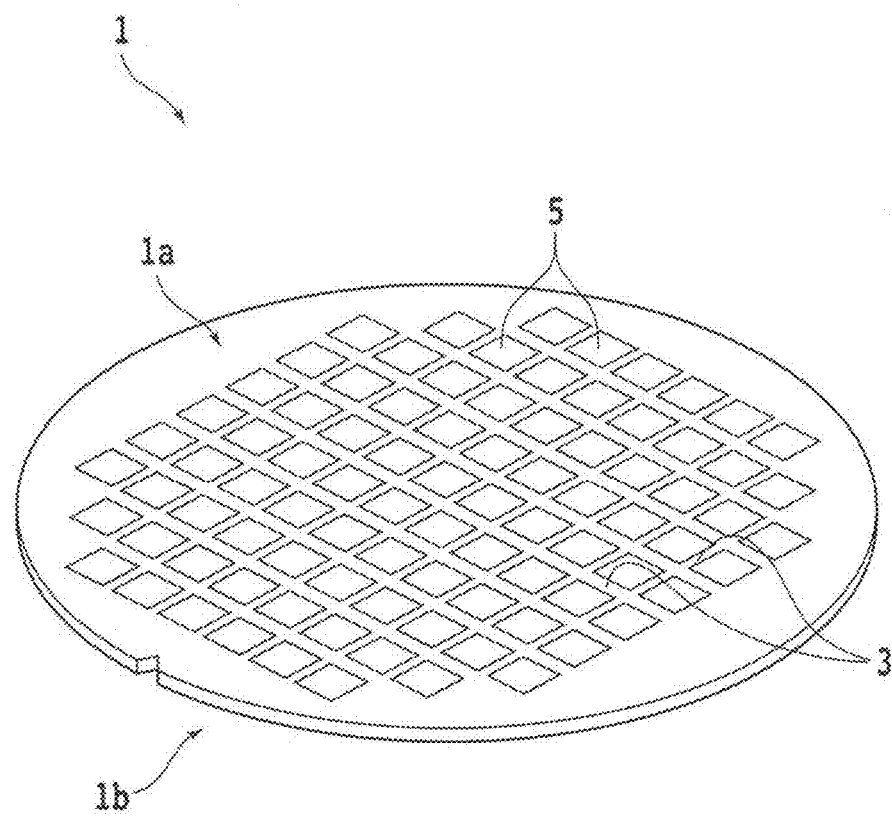
FIG. 1 is a perspective view schematically illustrating a wafer.

An embodiment of the present invention will be described with reference to the accompanying drawings. Description will first be made of a wafer in which a modified layer is formed by a wafer processing method according to the present embodiment. FIG. 1 is a perspective view schematically illustrating a wafer 1. The wafer 1 is, for example, a substantially disk-shaped substrate or the like formed of a material such as silicon (Si), silicon carbide (SiC), gallium nitride (GaN), gallium arsenide (GaAs), or another semiconductor, or a material such as sapphire, glass, or quartz. The glass is, for example, alkali glass, non-alkali glass, soda-lime glass, lead glass, borosilicate glass, quartz glass, or the like. A plurality of planned dividing lines 3 intersecting each other are set on a top surface 1a of the wafer 1. The planned dividing lines 3 are referred to also as streets. On the top surface 1a of the wafer 1, a device 5 is formed in each of regions demarcated by the planned dividing lines 3. The device 5 is, for example, an integrated circuit (IC), a large-scale integrated circuit (LSI), or the like. However, the wafer 1 is not limited to this. There are no limitations on the material, shape, structure, size, and the like of the wafer 1, and the device 5 may not be formed on the wafer 1.

When the wafer 1 is divided along the planned dividing lines 3, individual device chips having respective devices 5 are formed. At a time of dividing the wafer 1, for example, a modified layer is formed within the wafer 1 by condensing a laser beam within the wafer 1 along the planned dividing lines 3, and a crack is formed which extends along a thickness direction from the modified layer to the top surface 1a of the wafer 1. At this time, unless the processing conditions of the wafer 1 are appropriate and also the state of a laser processing apparatus is a state suitable for processing, the crack does not extend from the modified layer, or the crack extends in an unintended direction, for example, so that the wafer 1 cannot be divided appropriately. In this case, defective products are produced, and thus the yield of device chips is decreased.

Figure 2:
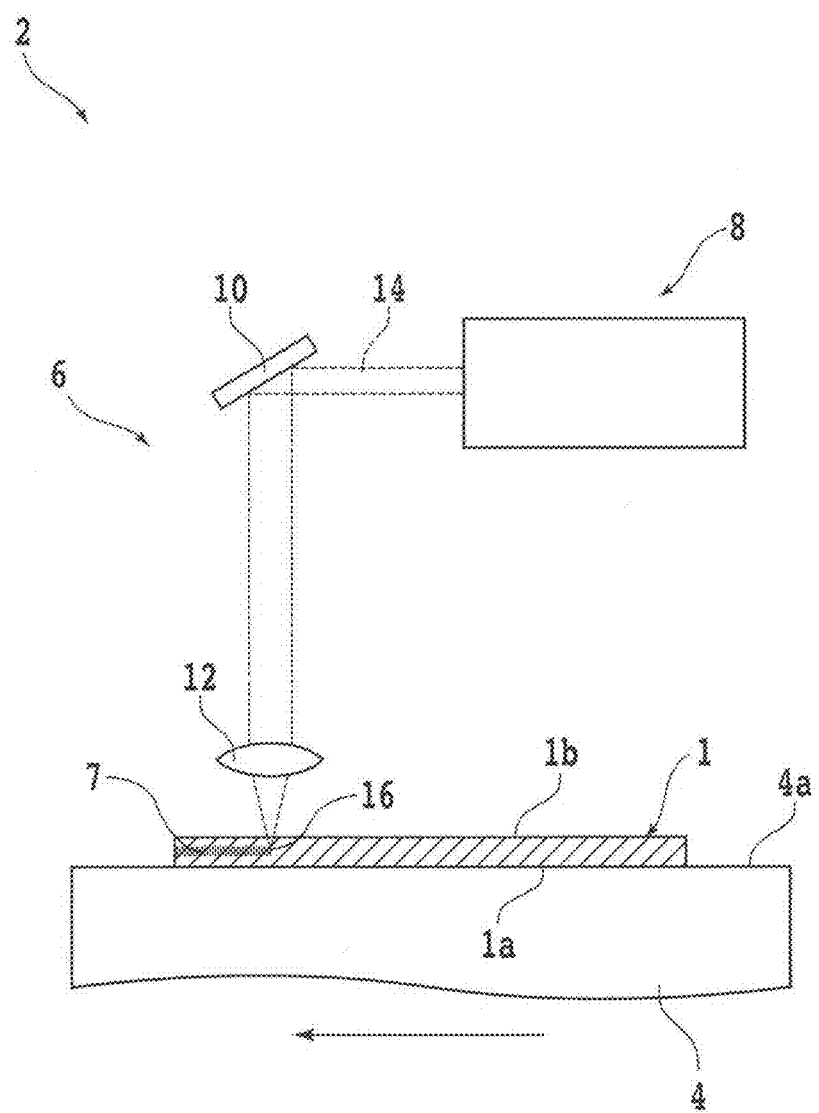
FIG. 2 is a sectional view schematically illustrating a modified layer forming step.

Next, referring to FIG. 2 and the like, description will be made of a laser processing apparatus 2 that performs a method of processing the wafer 1 according to the present embodiment. FIG. 2 is a sectional view schematically illustrating a state in which a modified layer is formed in the wafer 1 by using the laser processing apparatus 2. The laser processing apparatus 2 includes a chuck table 4 that holds the wafer 1 and a laser beam irradiating unit 6 that irradiates the wafer 1 held on the chuck table 4 with a laser beam. The chuck table 4 has a porous member (not illustrated) on an upper surface side. The upper surface of the porous member forms a holding surface 4a on which the wafer 1 is held. The chuck table 4 is rotatable about an axis perpendicular to the holding surface 4a. The chuck table 4 has a suction source (not illustrated) connected to the porous member.

At a time of processing the wafer 1 by the laser processing apparatus 2, the wafer 1 is placed on the holding surface 4a with the top surface 1a facing the holding surface 4a, and then a negative pressure produced by the suction source is made to act on the wafer 1 through the porous member. In this case, the wafer 1 is sucked and held on the chuck table 4 in a state in which an undersurface 1b side is exposed upward. The wafer 1 is laser-processed by being irradiated with the laser beam from the exposed undersurface 1b side.

At a time of holding the wafer 1 on the chuck table 4, a frame unit may be formed in advance which is obtained by integrating an annular frame, an adhesive tape whose periphery is affixed to the annular frame, and the wafer 1 with each other. At a time of forming the frame unit, the top surface 1a side of the wafer 1 is affixed to an adhesive surface of the adhesive tape exposed in an opening of the annular frame. In this case, at a time of holding the frame unit on the chuck table 4, the wafer 1 is placed on the holding surface 4a via the adhesive tape.

The chuck table 4 and the laser beam irradiating unit 6 can be moved relative to each other in a direction parallel with the holding surface 4a. For example, the chuck table 4 can be moved in a processing feed direction (X-axis direction) set as a direction parallel with the holding surface 4a, and the laser beam irradiating unit 6 can be moved in an indexing feed direction (Y-axis direction) parallel with the holding surface 4a and orthogonal to the processing feed direction.

FIG. 2 schematically illustrates a simplest configuration example of the laser beam irradiating unit 6 that can irradiate the wafer 1 held on the chuck table 4 with a laser beam. The laser beam irradiating unit 6 includes a laser oscillator 8 for oscillating a laser, a mirror 10, and a condensing lens 12.

The laser oscillator 8 has a function of emitting a first laser beam 14 of a wavelength transmissible through the wafer 1 (wavelength that passes through the wafer 1). A laser having a wavelength of 1099 nm and oscillated with Nd:YAG or the like as a medium, for example, is used as the first laser beam 14. However, the laser oscillator 8 and the first laser beam 14 are not limited to this but are selected according to the material of the wafer 1 or the like. At a time of forming a modified layer within the wafer 1, the power of the first laser beam 14 is set to approximately 2 to 3 W, for example. However, the power of the first laser beam 14 is not limited to this, but it suffices for the power of the first laser beam 14 to be a power at which a modified layer can be formed within the wafer 1. The first laser beam 14 emitted from the laser oscillator 8 is reflected in a predetermined direction by the mirror 10 and is applied to the wafer 1 held on the chuck table 4 through the condensing lens 12.

The condensing lens 12 has a function of condensing the first laser beam 14 at a predetermined height position within the wafer 1 held on the chuck table 4. The condensing lens 12 is, for example, movable along a height direction and can thereby change the height position of a condensing point 16. The condensing point 16 of the first laser beam 14 is positioned at a predetermined height position within the wafer 1. As illustrated in FIG. 2, a modified layer 7 is formed within the wafer 1 when the first laser beam 14 is condensed within the wafer 1 while the laser beam irradiating unit 6 and the chuck table 4 are moved relative to each other along the processing feed direction. Here, when processing conditions such as the irradiation condition of the first laser beam 14, and a processing feed speed are set appropriately, a crack 9 extending from the modified layer 7 to the top surface 1a of the wafer 1 is formed as illustrated in FIG. 3B, so that the wafer 1 can be divided easily and appropriately.

Figure 3A:
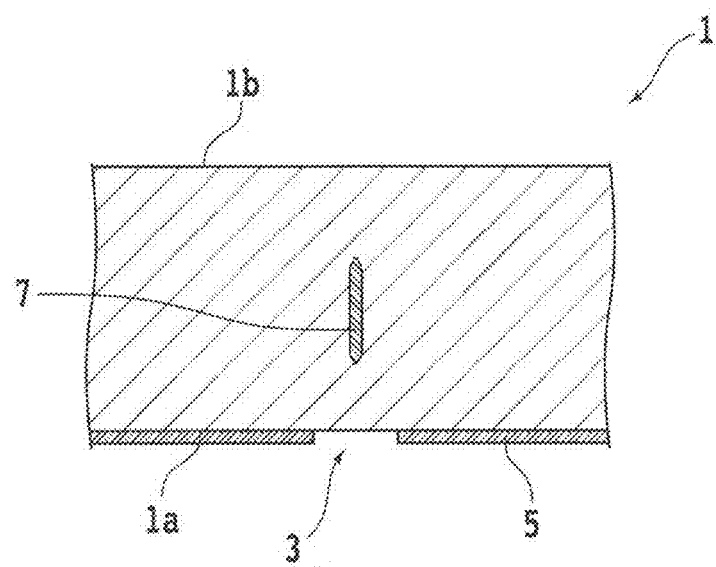
FIG. 3A is a sectional view schematically illustrating in enlarged dimension the wafer within which a modified layer is formed.
Figure 3B:
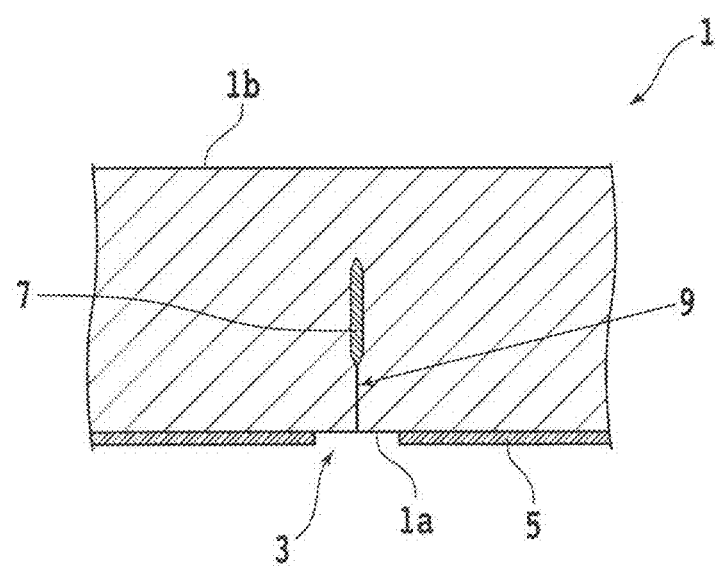
FIG. 3B is a sectional view schematically illustrating in enlarged dimension the wafer within which a modified layer and a crack are formed.

However, when the processing conditions or the like are inappropriate, the crack 9 does not extend appropriately from the formed modified layer 7, as illustrated in FIG. 3A, or the crack 9 extends in an unintended direction, for example, so that the wafer 1 cannot be divided appropriately. Further, when the optical axis of an optical system is displaced, the modified layer 7 is not formed at a predetermined position, so that the wafer 1 cannot be divided appropriately. The yield of the device chips is therefore decreased. Here, in order to check whether or not the wafer 1 is processed appropriately, the top surface 1a of the wafer 1 may, for example, be observed by a microscope or the like. That is, the top surface 1a of the wafer 1 may be observed by a microscope or the like to check whether or not the crack 9 is developed appropriately from the modified layer 7 to the top surface 1a of the wafer 1 and whether or not the modified layer 7 is formed appropriately at an intended position.

However, in order to observe the top surface 1a side of the wafer 1 irradiated with the first laser beam 14 from the undersurface 1b side, it is necessary, for example, to extract the wafer 1 from the laser processing apparatus 2, vertically invert the wafer 1, and carry the wafer 1 into a microscope or the like. Therefore, there is a problem in that it takes man-hours to check a processed state such as the presence or absence of the crack 9. Accordingly, the wafer processing method according to the present embodiment reduces the checking man-hours by checking the processed state of the wafer 1 in the laser processing apparatus 2. A configuration used to check the processed state will next be described.

Figure 4:
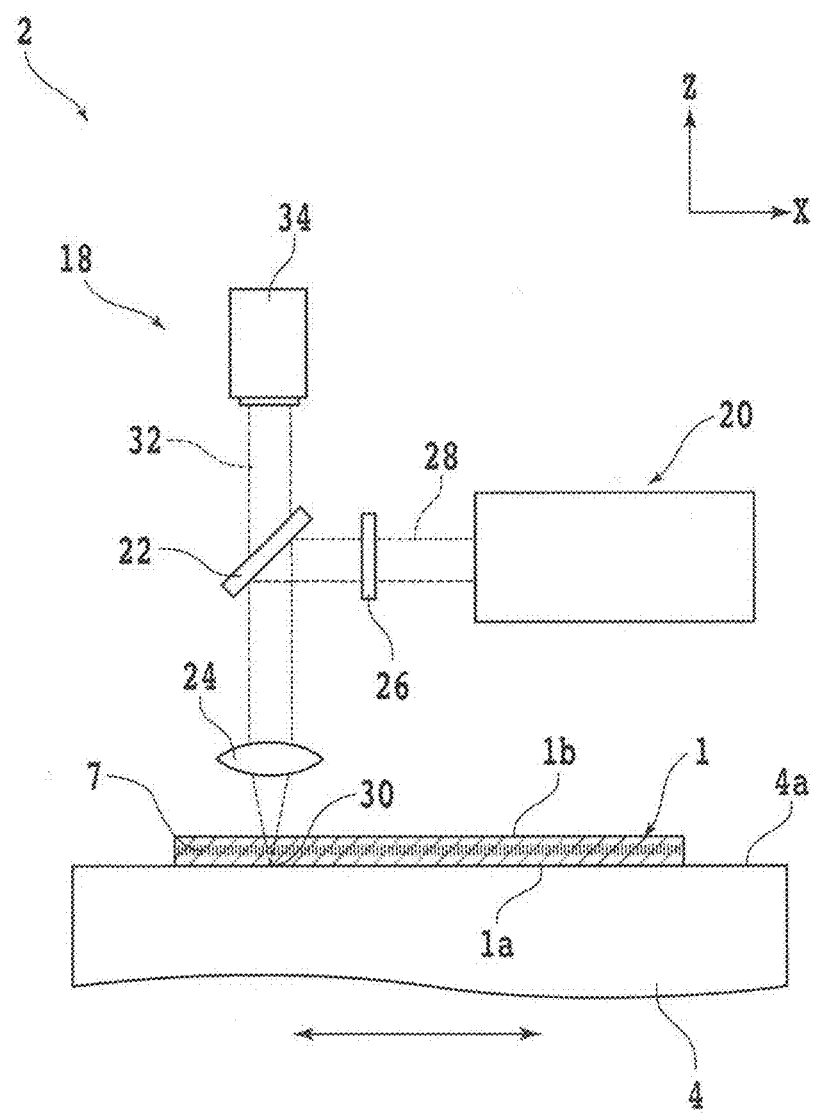
FIG. 4 is a sectional view schematically illustrating an observation laser beam applying step.

As illustrated in FIG. 4, the laser processing apparatus 2 includes an observation laser beam irradiating unit 18. The observation laser beam irradiating unit 18 has a function of irradiating the wafer 1 in which the modified layer 7 is formed with a second laser beam 28 as a laser beam for observation. FIG. 4 schematically illustrates a simplest configuration example of the observation laser beam irradiating unit 18 that can irradiate the wafer 1 held on the chuck table 4 with the second laser beam 28. The observation laser beam irradiating unit 18 includes a laser oscillator 20, a dichroic mirror 22, a condensing lens 24, and a beam forming unit 26 that forms the shape of the second laser beam 28 into a specific shape. The laser oscillator 20 can emit the second laser beam 28 with a power not exceeding a processing threshold value at which a modified layer can be formed within the wafer 1.

The laser oscillator 20, for example, emits the second laser beam 28 with a power of approximately 0.2 W not exceeding the processing threshold value. However, the power of the second laser beam 28 is not limited to this. The processing threshold value differs according to the material of the wafer 1. Thus, the power of the second laser beam 28 is determined appropriately so as not to exceed the processing threshold value according to the material of the processed wafer 1. Preferably, the power of the second laser beam 28 is set between one tenth and one thousandth of the power of the first laser beam 14. More preferably, the power of the second laser beam 28 is set at approximately one thirtieth of the first laser beam 14.

The dichroic mirror 22 has a function of reflecting the second laser beam 28 in a predetermined direction. The dichroic mirror 22 also has a function of transmitting reflected light 32 of the second laser beam 28 when the reflected light 32 reaches the dichroic mirror 22 after the second laser beam 28 is reflected by the top surface 1a side of the wafer 1, as will be described later. The condensing lens 24 has a function of condensing the second laser beam 28 within the wafer 1 held on the chuck table 4 or at the top surface 1a of the wafer 1. The condensing lens 24 is, for example, movable along the height direction, and can thereby change the height position of a condensing point 30.

Incidentally, the observation laser beam irradiating unit 18 may be able to irradiate the wafer 1 held on the chuck table 4 with the first laser beam 14 having a power exceeding the processing threshold value of the wafer 1. That is, the observation laser beam irradiating unit 18 may be able to function as the laser beam irradiating unit 6 described with reference to FIG. 2. In this case, the laser beam irradiating unit 6 can be omitted, so that the configuration of the laser processing apparatus 2 is simplified. Hence, the first laser beam 14 and the second laser beam 28 may be from a same light source. On the other hand, the wafer 1 can be processed efficiently when the laser processing apparatus 2 has another chuck table in the case where the laser processing apparatus 2 includes both of the laser beam irradiating unit 6 and the observation laser beam irradiating unit 18. For example, it is possible to irradiate one wafer 1 with the second laser beam 28 and simultaneously irradiate another wafer 1 with the first laser beam 14.

The beam forming unit 26 included in the observation laser beam irradiating unit 18 has a function of forming the shape of the second laser beam 28 emitted from the laser oscillator 20 into a specific shape. The beam forming unit 26 is, for example, a plate-shaped member having a transmitting window (not illustrated) having a shape corresponding to the specific shape and a shielding portion (not illustrated) that shields the second laser beam 28 on the periphery of the transmitting window. The transmitting window is formed so as to penetrate the beam forming unit 26. The beam forming unit 26 is incorporated into the observation laser beam irradiating unit 18 while the orientation of the beam forming unit 26 is adjusted such that the penetrating direction of the transmitting window coincides with the traveling direction of the second laser beam 28. When the second laser beam 28 reaches the beam forming unit 26, the second laser beam 28 is formed into the specific shape with a part of the second laser beam 28 passing through the transmitting window and with the rest shielded by the shielding portion.

Alternatively, a diffractive optical element (DOE) may be incorporated as the beam forming unit 26 in the observation laser beam irradiating unit 18. In this case, the DOE is designed and manufactured so as to be able to form the second laser beam 28 into a predetermined shape. Further, a spatial light modulator including a liquid crystal on silicon (LCOS) element may be incorporated as the beam forming unit 26 in the observation laser beam irradiating unit 18.

In the wafer processing method according to the present embodiment, the second laser beam 28 is formed such that the sectional shape of the second laser beam 28 in a plane (for example, the undersurface 1b) perpendicular to the traveling direction of the second laser beam 28 is not axisymmetric with respect to an axis assumed along a planned dividing line 3 when the second laser beam 28 is applied to the undersurface 1b of the wafer 1. For example, the sectional shape of the second laser beam 28 is a semicircular shape positioned on one side of two regions separated from each other by the axis. The second laser beam 28 is applied from the undersurface 1b side to the wafer 1, and travels within the wafer 1. Then, reaching the top surface 1a of the wafer 1, the second laser beam 28 is reflected by the top surface 1a of the wafer 1. Thereafter, the reflected light 32 of the second laser beam 28 travels in an opposite direction within the wafer 1, and travels from the undersurface 1b to the outside of the wafer 1.

The reflected light 32 of the second laser beam 28 is converted into collimated light by passing through the condensing lens 24 and passes through the dichroic mirror 22. An imaging unit 34 that images the reflected light 32 is disposed on the traveling path of the reflected light 32 passing through the dichroic mirror 22. The imaging unit 34, for example, includes an image sensor such as a complementary metal oxide semiconductor (CMOS) sensor or a charge coupled device (CCD) sensor. The imaging unit 34 images the reflected light 32 and forms an image displaying the reflected light 32. As will be described later, determination of the processed state of the wafer 1 as to whether or not the crack 9 extends appropriately from the modified layer 7 formed within the wafer 1 to the top surface 1a or the like is made on the basis of the image formed by the imaging unit 34 by imaging the reflected light 32. In addition, the image is used also when whether or not the modified layer 7 is appropriately formed at an intended position is determined by detecting the formation position of the modified layer 7, for example.

Figure 12:
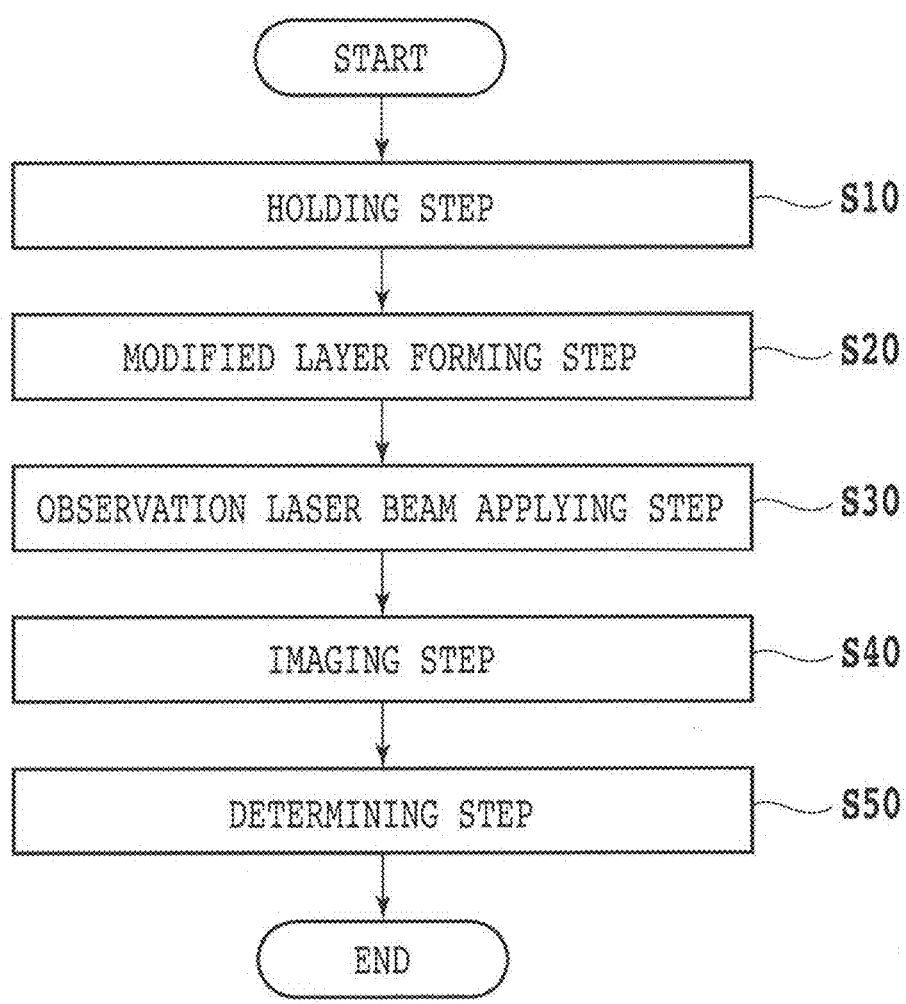
FIG. 12 is a flowchart illustrating a flow of steps of a wafer processing method.

The wafer processing method according to the present embodiment will next be described. The wafer processing method is, for example, performed in the laser processing apparatus 2. The wafer processing method forms the modified layer 7 within the wafer 1 along the planned dividing lines 3 of the wafer 1 having the plurality of planned dividing lines 3 set on the top surface 1a. FIG. 12 is a flowchart of assistance in explaining a flow of steps of the wafer processing method. In the following, each of the steps will be described in detail.

First, a holding step S10 is performed which carries the wafer 1 into the laser processing apparatus 2, makes the top surface 1a of the wafer 1 face the chuck table 4, and holds the wafer 1 by the chuck table 4. In the holding step S10, the top surface 1a side of the wafer 1 is made to face the holding surface 4a of the chuck table 4 such that the undersurface 1b side of the wafer 1 is exposed upward, and the wafer 1 is placed on the chuck table 4. Thereafter, when a negative pressure is made to act on the wafer 1 by actuating the suction source of the chuck table 4, the wafer 1 is sucked and held on the chuck table 4. FIG. 2 schematically illustrates a sectional view of the wafer 1 sucked and held on the chuck table 4. Incidentally, before the holding step S10 is performed, a protective member disposing step may be performed with affixes a protective member such as an adhesive tape to the top surface 1a of the wafer 1 in advance. In this case, the wafer 1 is held on the chuck table 4 via the protective member in the holding step S10.

Next, a modified layer forming step S20 is performed which forms modified layers 7 within the wafer 1 by applying the first laser beam 14 along the planned dividing lines 3 from the undersurface 1b side of the wafer 1. The first laser beam 14 is a laser beam of a wavelength transmissible through the wafer 1 (wavelength that can pass through the wafer 1). FIG. 2 is a sectional view schematically illustrating the modified layer forming step S20. In the modified layer forming step S20, first, the chuck table 4 and the laser beam irradiating unit 6 are moved relative to each other, and one end of one planned dividing line 3 of the wafer 1 is positioned below the laser beam irradiating unit 6. At the same time, the planned dividing line 3 of the wafer 1 is aligned with the processing feed direction by rotating the chuck table 4. Then, the condensing point 16 of the first laser beam 14 is positioned at a predetermined height position within the wafer 1.

Thereafter, the wafer 1 is irradiated with the first laser beam 14 while the chuck table 4 and the laser beam irradiating unit 6 are moved relative to each other in the processing feed direction. When the wafer 1 is irradiated with the first laser beam 14 under conditions appropriate for the processing of the wafer 1, a modified layer 7 along the planned dividing line 3 is formed within the wafer 1, and a crack 9 (see FIG. 3B and the like) extending from the modified layer 7 to the top surface 1a of the wafer 1 is formed. After the modified layer 7 is formed along the one planned dividing line 3 of the wafer 1, the chuck table 4 and the laser beam irradiating unit 6 are moved relative to each other in the indexing feed direction, and a modified layer 7 is similarly formed within the wafer 1 along another planned dividing line 3. After modified layers 7 are formed along all of the planned dividing lines 3 along one direction, the chuck table 4 is rotated, and a modified layer 7 is similarly formed along planned dividing lines 3 along another direction. The modified layer forming step S20 is completed when the first laser beam 14 is applied along all of the planned dividing lines 3 of the wafer 1. Incidentally, in each of the planned dividing lines 3, a plurality of modified layers 7 superposed on each other may be formed by applying the first laser beam 14 twice or more while changing the height of the condensing point 16.

When the wafer 1 within which the modified layer 7 and the crack 9 extending from the modified layer 7 are formed along each planned dividing line 3 is thinned by grinding the wafer 1 from the undersurface 1b side, and the modified layer 7 and the like are removed, the wafer 1 is divided, and individual device chips are obtained. However, the wafer 1 cannot be divided appropriately unless the crack 9 appropriately extends to the top surface 1a of the wafer 1. In addition, the wafer 1 cannot be divided appropriately also in a case where the formation position of the modified layer 7 is not at an intended position or in a case where the modified layer 7 meanders without forming a linear shape along the planned dividing line 3. In these cases, the quality of the formed device chips may not meet a standard. In addition, the device chips may be damaged. That is, the yield of the device chips is decreased.

FIG. 3A is a sectional view schematically illustrating in enlarged dimension the wafer 1 within which the modified layer 7 is formed but the crack 9 is not formed. In addition, FIG. 3B is a sectional view schematically illustrating in enlarged dimension the wafer 1 within which the crack 9 reaching the top surface 1a from the modified layer 7 is formed together with the modified layer 7. As illustrated in FIG. 3B, when the crack 9 reaches the top surface 1a, and the top surface 1a of the wafer 1 is observed by a microscope, the crack 9 is visually recognized. When the crack 9 is not formed, on the other hand, the crack 9 cannot be visually recognized on the top surface 1a. Accordingly, in order to check the presence or absence of the crack 9 after the modified layer 7 is formed in the wafer 1, the top surface 1a side of the wafer 1 may be observed by a microscope. However, in order to observe the top surface 1a by a microscope, the wafer 1 needs to be carried out from the chuck table 4 and moved to the microscope. Accordingly, in order to determine the processed state of the wafer 1, the wafer processing method according to the present embodiment performs an observation laser beam applying step S30, an imaging step S40, and a determining step S50.

Next, description will be made of the observation laser beam applying step S30 performed after the modified layer forming step S20. In the observation laser beam applying step S30, the wafer 1 held on the chuck table 4 is irradiated with the second laser beam 28 as an observation laser beam from the observation laser beam irradiating unit 18. The second laser beam 28 is a laser beam having a power not exceeding the processing threshold value of the wafer 1 and having a wavelength transmissible through the wafer 1 (wavelength that can pass through the wafer 1). FIG. 4 is a side view schematically illustrating the observation laser beam applying step S30. At a time of irradiating the wafer 1 having the modified layer 7 formed therewithin with the second laser beam 28 from the undersurface 1b side, the condensing point 30 is positioned within the wafer 1 or at the top surface 1a of the wafer 1 in advance. Preferably, the condensing point 30 is positioned at a position coinciding with the planned dividing line 3 on the top surface 1a of the wafer 1 or in the vicinity of the position.

The second laser beam 28 emitted from the laser oscillator 20 reaches the beam forming unit 26 and is formed into a predetermined shape by the beam forming unit 26. Thereafter, the second laser beam 28 is reflected by the dichroic mirror 22, and travels toward the chuck table 4. Then, after passing through the condensing lens 24, the second laser beam 28 is applied to the undersurface 1b of the wafer 1, travels within the wafer 1, and is condensed to the condensing point 30. The second laser beam 28 traveling within the wafer 1 is reflected by the top surface 1a of the wafer 1. Then, the reflected light 32 of the second laser beam 28 travels within the wafer 1, and travels to the outside through the undersurface 1b of the wafer 1. The reflected light 32 thereafter passes through the condensing lens 24 and the dichroic mirror 22 and reaches the imaging unit 34.

Figure 6A:
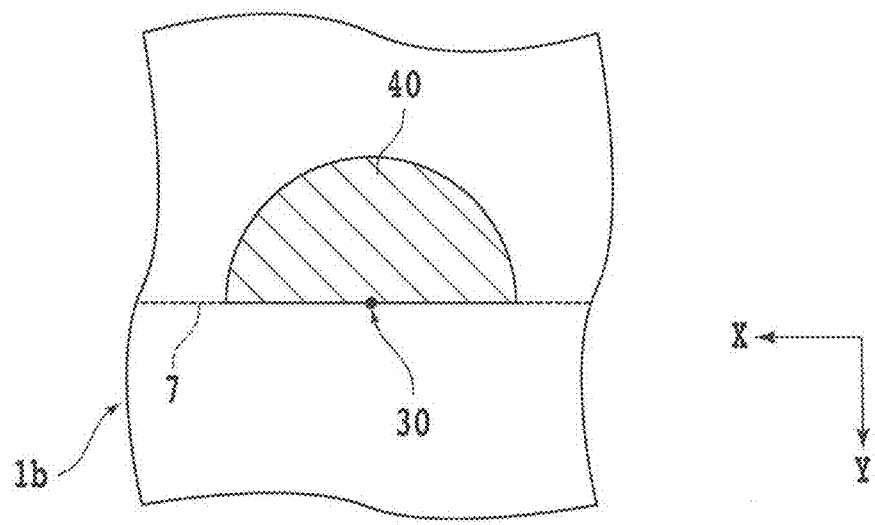
FIG. 6A is a plan view schematically illustrating a region irradiated with the second laser beam in the undersurface of the wafer.

FIG. 6A is a plan view schematically illustrating an example of the sectional shape of the second laser beam 28 applied to the wafer 1. Specifically, FIG. 6A illustrates a region 40 irradiated with the second laser beam 28 in the undersurface 1b of the wafer 1. The region 40 is hatched. Further, for the convenience of description, FIG. 6A illustrates a broken line schematically representing the plane position of the modified layer 7 formed within the wafer 1 along the planned dividing line 3 and a point schematically representing the plane position of the condensing point 30. As illustrated in FIG. 6A, the sectional shape of the second laser beam 28 is, for example, a semicircular shape. As illustrated in FIG. 6A, the second laser beam 28 is formed by the beam forming unit 26 in advance such that the sectional shape of the second laser beam 28 in a surface (for example, the undersurface 1b of the wafer 1) perpendicular to the traveling direction of the second laser beam 28 is asymmetric with respect to an axis assumed along the planned dividing line 3.

Figure 5A:
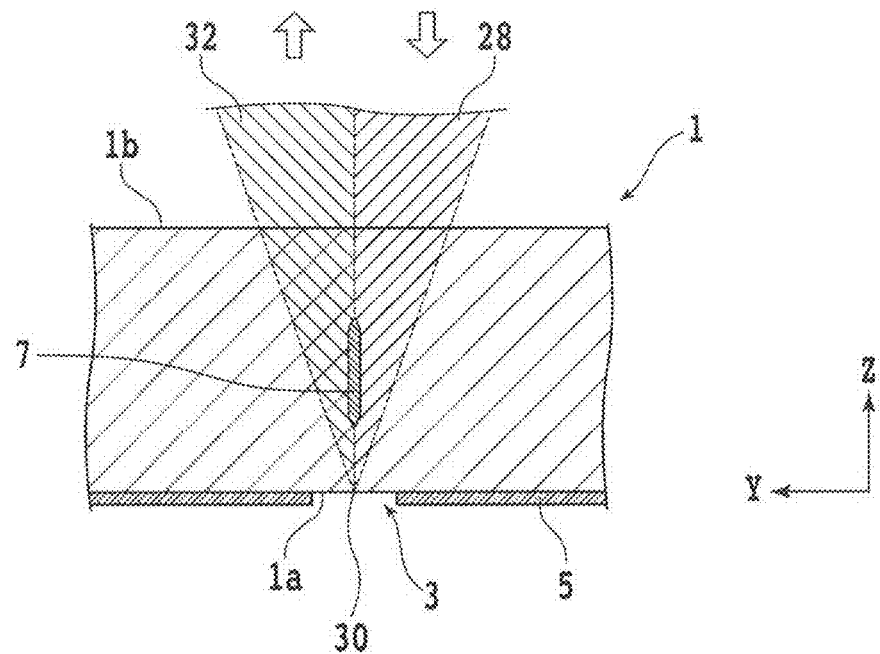
FIG. 5A is a sectional view schematically illustrating a second laser beam applied to the wafer within which the modified layer is formed and reflected light of the second laser beam.
Figure 5B:
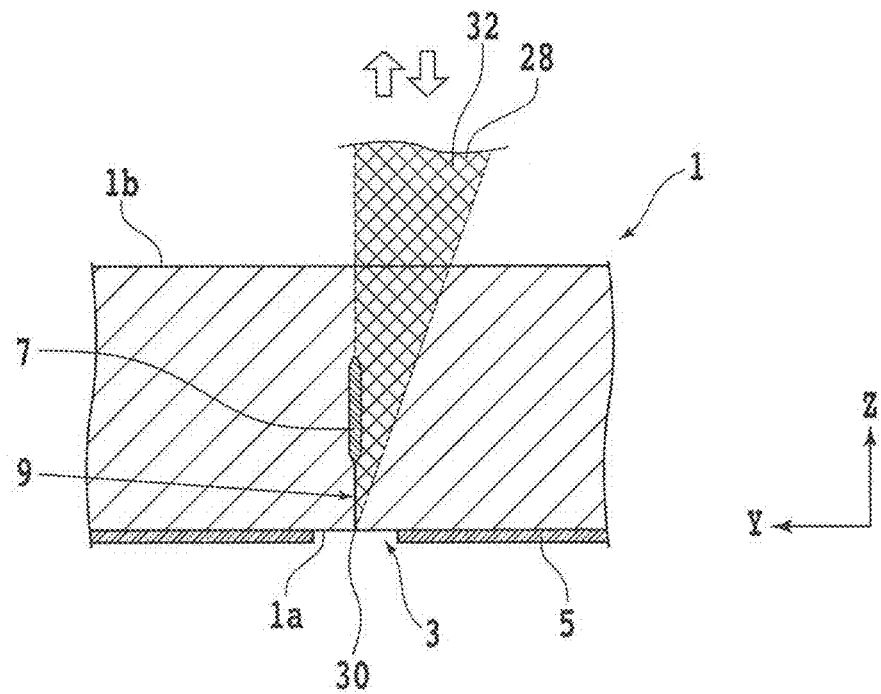
FIG. 5B is a sectional view schematically illustrating the second laser beam applied to the wafer within which the modified layer and the crack are formed and reflected light of the second laser beam.

Here, detailed description will be made of the path of the reflected light 32 of the second laser beam 28 reflected at the condensing point 30 located at the top surface 1a of the wafer 1. FIG. 5A is a sectional view schematically illustrating the traveling paths of the second laser beam 28 and the reflected light 32 in a case where the crack 9 extending from the modified layer 7 to the top surface 1a of the wafer 1 is not formed. FIG. 5B is a sectional view schematically illustrating the paths of the second laser beam 28 and the reflected light 32 in a case where the crack 9 extending from the modified layer 7 is formed. Incidentally, the sectional view of FIG. 5A and the sectional view of FIG. 5B are drawings of assistance in explaining effects of the presence or absence of the crack 9 on the reflected light 32. For the convenience of description, the sectional view of FIG. 5A and the sectional view of FIG. 5B emphasize characteristics such as relative positional relations between the wafer 1, the modified layer 7, the planned dividing line 3, and the crack 9, and angles at which the second laser beam 28 and the reflected light 32 travel.

As illustrated in FIG. 5A and FIG. 5B, the second laser beam 28 applied to the undersurface 1b side of the wafer 1 is condensed to the condensing point 30. Then, the second laser beam 28 is reflected by the top surface 1a of the wafer 1, and the reflected light 32 travels within the wafer 1 and reaches the undersurface 1b of the wafer 1. In a case where the condensing point 30 is located below the modified layer 7 and in the top surface 1a, when the crack 9 reaching the top surface 1a of the wafer 1 from the modified layer 7 is not formed within the wafer 1, the second laser beam 28 passes and travels through a region below the modified layer 7. As illustrated in FIG. 5A, the second laser beam 28 (incident light) and the reflected light 32 are inverted from each other with the modified layer 7 interposed therebetween.

In the case where the crack 9 reaching the top surface 1a of the wafer 1 from the modified layer 7 is formed within the wafer 1, on the other hand, the second laser beam 28 reaches the crack 9 below the modified layer 7 and is affected by the crack 9. In the case where the crack 9 reaches the top surface 1a of the wafer 1, the wafer 1 is slightly divided by the crack 9, and therefore an interface is formed between a layer of air entering the crack 9 and the wafer 1. Because light is reflected at the interface with a large difference between refractive indexes on both sides, the second laser beam 28 reaching the crack 9 is reflected by the crack 9 as in the case where the second laser beam 28 is reflected at the top surface 1a. In this case, as illustrated in FIG. 5B, the reflected light 32 travels backward in a region similar to a region within the wafer 1 through which region the second laser beam 28 (incident light) has passed, and the reflected light 32 reaches the undersurface 1b of the wafer 1.

Further, in the observation laser beam applying step S30, the chuck table 4 and the observation laser beam irradiating unit 18 are moved relative to each other along the planned dividing line 3. For example, the chuck table 4 is moved in the processing feed direction (X-axis direction). Specifically, the undersurface 1b of the wafer 1 is successively irradiated with the second laser beam 28 while the wafer 1 and the condensing point 30 are moved relative to each other along the planned dividing line 3. In a case where the modified layer 7 formed in the modified layer forming step S20 is linearly formed along the planned dividing line 3 without meandering, each time the undersurface 1b of the wafer 1 is irradiated with the second laser beam 28, the second laser beam 28 is similarly reflected at the top surface 1a. As a result, the reflected light 32 travels within the wafer 1 in a similar path. On the other hand, in a case where the processing conditions of the wafer 1 are inappropriate and the modified layer 7 meanders, the traveling path of the reflected light 32 changes when a meandering part of the modified layer 7 is irradiated with the second laser beam 28. It is therefore possible to evaluate the processed state of the wafer 1 by repeatedly observing the reflected light 32.

Alternatively, in the observation laser beam applying step S30, the observation laser beam irradiating unit 18 is moved in the indexing feed direction (Y-axis direction), for example. Specifically, the undersurface 1b of the wafer 1 is successively irradiated with the second laser beam 28 while the wafer 1 and the condensing point 30 are moved in a direction orthogonal to the direction along the planned dividing line 3 such that the condensing point 30 crosses the modified layer 7 (such that the condensing point 30 passes below the modified layer 7). There is, for example, a case where the processing conditions are not appropriate in the modified layer forming step S20, the modified layer 7 is consequently formed at a height position that is too distant from the top surface 1a, and as a result, the crack 9 extending from the modified layer 7 is not formed. In this case, in order to obtain a knowledge of a formation depth of the modified layer 7, the wafer 1 is repeatedly irradiated with the second laser beam 28 while the condensing point 30 is moved so as to cross the modified layer 7. At this time, the second laser beam 28 or the reflected light 32 hits the modified layer 7. When the condensing point 30 moves, a manner in which the second laser beam 28 or the like hits the modified layer 7 changes, and thus the traveling path of the reflected light 32 changes. The manner of this change depends on the formation height of the modified layer 7. The processed state of the wafer 1 can therefore be evaluated by repeatedly observing the reflected light 32.

The wafer processing method according to the present embodiment next performs the imaging step S40 of imaging, by the imaging unit 34, the reflected light 32 of the second laser beam 28 applied to the wafer 1 in the observation laser beam applying step S30. In the imaging step S40, the reflected light 32 is imaged, and an image displaying the reflected light 32 is formed.

Figure 6B:
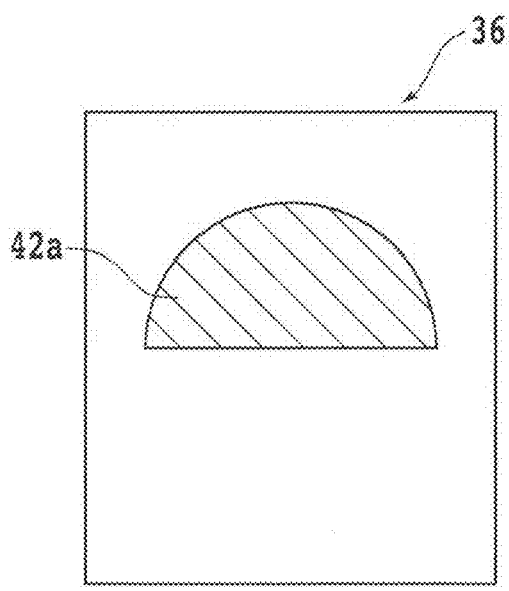
FIG. 6B is a plan view schematically illustrating an example of a region illustrating reflected light in an image displaying the reflected light.
Figure 6C:
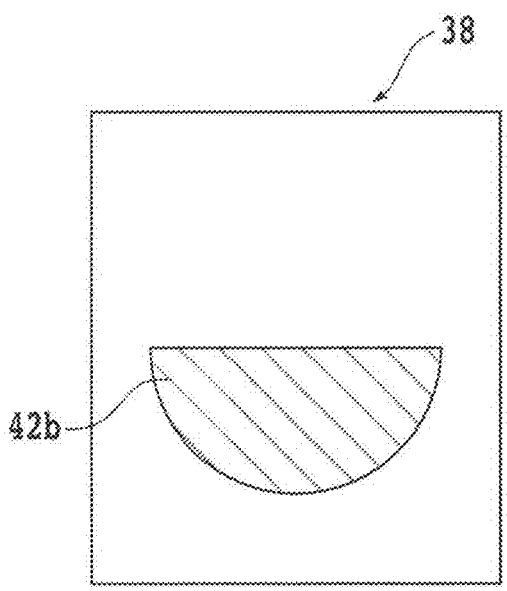
FIG. 6C is a plan view schematically illustrating another example of the region illustrating the reflected light in the image displaying the reflected light.

FIG. 6C is a plan view schematically illustrating a region 42b illustrating the reflected light 32 in an image 38 imaged and formed by the imaging unit 34 in the case where the crack 9 reaching the top surface 1a from the modified layer 7 is not formed. In the case where the crack 9 is not formed, as illustrated in FIG. 5A, the second laser beam 28 (incident light) and the reflected light 32 are inverted from each other with the modified layer 7 interposed therebetween. Therefore, the shape of the reflected light 32 of the second laser beam 28 appearing in the image 38 is a shape such that the sectional shape of the second laser beam 28 is inverted. In a case where the sectional shape of the second laser beam 28 is a semicircular shape, the region 42b illustrating the reflected light 32 has a shape obtained by inverting the semicircular shape, as illustrated in FIG. 6C.

In addition, FIG. 6B is a plan view schematically illustrating a region 42a illustrating the reflected light 32 in an image 36 imaged and formed by the imaging unit 34 in the case where the crack 9 extends from the modified layer 7 to the top surface 1a. In the case where the crack 9 extends from the modified layer 7 to the top surface 1a, the paths of the second laser beam 28 (incident light) and the reflected light 32 coincide with each other, as illustrated in FIG. 5B. Therefore, in the case in which the sectional shape of the second laser beam 28 is a semicircular shape, the region 42a illustrating the reflected light 32 has a shape similar to the semicircular shape, as illustrated in FIG. 6B.

Thus, the shape or the like of the reflected light 32 appearing in the images 36 and 38 formed by imaging the reflected light 32 in the imaging step S40 changes according to the presence or absence of the crack 9. It is therefore possible to determine whether or not the crack 9 reaching the top surface 1a from the modified layer 7 is formed within the wafer 1 on the basis of the images 36 and 38.

Figure 7A:
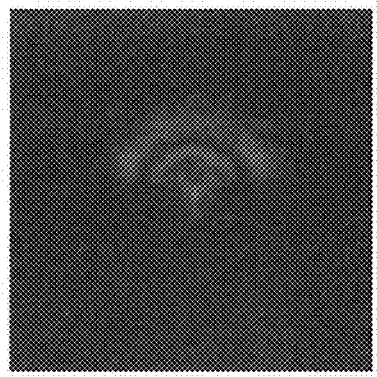
FIG. 7A and FIG. 7B are images displaying the reflected light in a case where the crack is formed in the wafer.
Figure 7B:
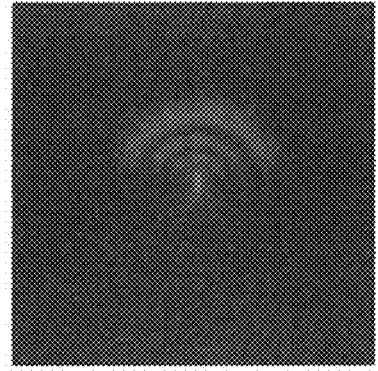
Figure 7C:
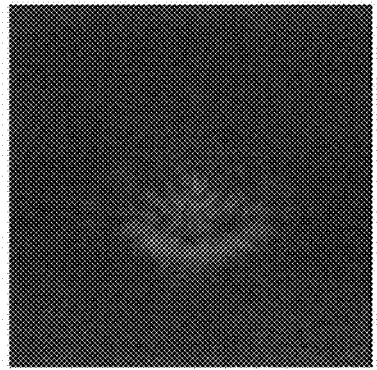
FIG. 7C and FIG. 7D are images displaying the reflected light in a case where the crack is not formed in the wafer.
Figure 7D:
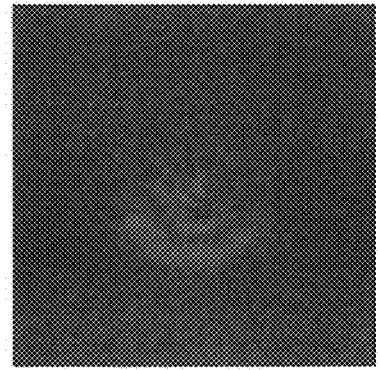

FIG. 7A and FIG. 7B are photographs illustrating an example of images photographed by the imaging unit 34 in the case where the crack 9 is formed in the wafer 1. In addition, FIG. 7C and FIG. 7D are photographs illustrating an example of images photographed by the imaging unit 34 in the case where the crack 9 is not formed in the wafer 1. Each of the photographs illustrates, in white, the reflected light 32 of the second laser beam 28 reflected at the top surface 1a of the wafer 1. The shape and position of the reflected light 32 appearing in the images change according to whether or not the crack 9 is formed in the wafer 1. It is therefore understood that the shape and position of the reflected light 32 appearing in each photograph can be a criterion for determining the processed state of the wafer 1, the processed state being typified by the presence or absence of the crack 9 or the like. Incidentally, as is understood from each photograph, the reflected light 32 does not necessarily appear with uniform intensity in the region illustrating the reflected light 32. That is, the reflected light 32 is not necessarily distributed uniformly in the entire region 42a illustrated in FIG. 6B or in the entire region 42b illustrated in FIG. 6C. The reflected light 32 appears in a stripe shape or a spot shape in the images due to various factors caused by an optical phenomenon and the like. However, the processed state of the wafer 1 can be determined adequately even when the reflected light 32 appears nonuniformly in the images.

The wafer processing method according to the present embodiment performs the determining step S50 of determining the processed state of the wafer 1 on the basis of images photographed in the imaging step S40. Here, the processed state, for example, refers to the state of the wafer 1 processed by applying the first laser beam 14, and includes a processing result. The processed state, for example, refers to the presence or absence of the crack 9 reaching the top surface 1a from the modified layer 7, a height position at which the modified layer 7 is formed, the presence or absence of the meandering of the modified layer 7, and the like. Details of determination made in the determining step S50 will be described. In the determining step S50, the processed state of the wafer 1 is determined from the position and shape of the reflected light 32 appearing in images photographed in the imaging step S40. Description will first be made of the determining step S50 in a case where the wafer 1 is irradiated with the second laser beam 28 while the condensing point 30 is relatively moved in a direction along a planned dividing line (X-axis direction) in the observation laser beam applying step S30.

Figure 8A:
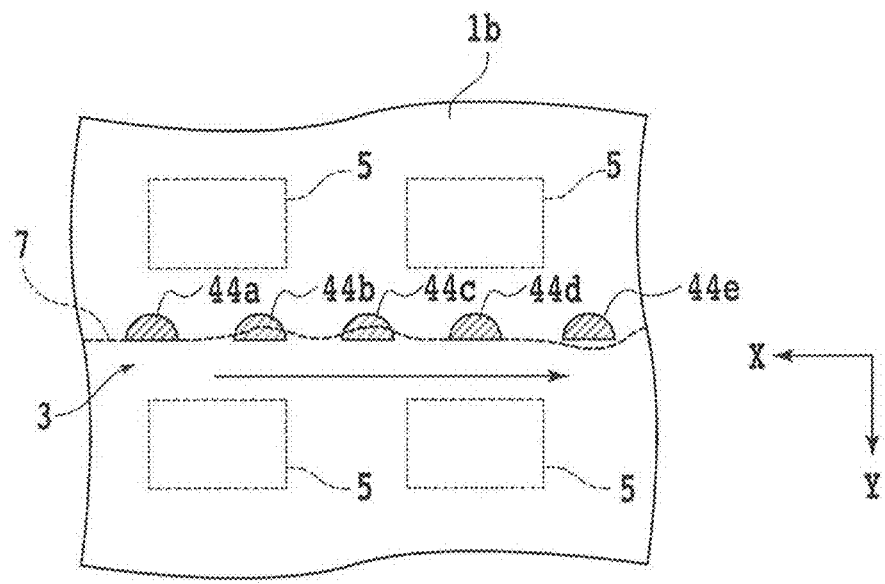
FIG. 8A is a plan view schematically illustrating regions irradiated with the second laser beam.

FIG. 8A is a plan view schematically illustrating a region irradiated with the second laser beam 28 in the undersurface 1b of the wafer 1 in the observation laser beam applying step S30. The modified layer 7 along the planned dividing line 3 is formed within the wafer 1 illustrated in FIG. 8A. The formation position of the modified layer 7 is represented by a broken line in FIG. 8A. In the wafer 1 illustrated in FIG. 8A, a crack reaching the top surface 1a from the modified layer 7 is formed, but the modified layer 7 is meandered.

Figure 9A:
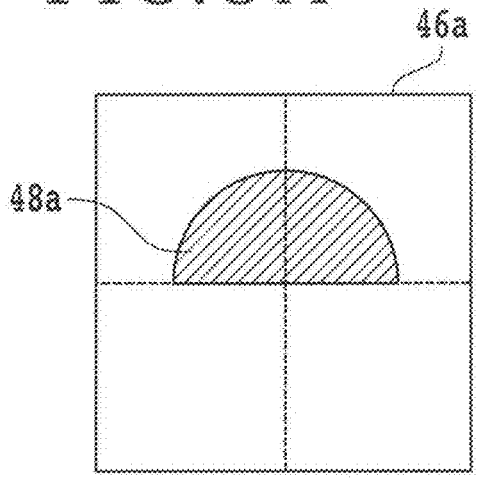
FIG. 9A, FIG. 9B, FIG. 9C, FIG. 9D, and FIG. 9E are plan views schematically illustrating regions illustrating the reflected light in images displaying the reflected light.
Figure 9B:
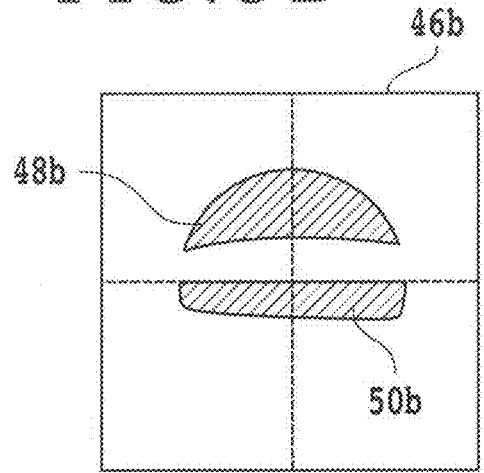

In the example illustrated in FIG. 8A, the condensing point 30 is positioned at a position superposed on the modified layer 7 in the top surface 1a, and the undersurface 1b of the wafer 1 is irradiated with the second laser beam 28 five times while the condensing point 30 is relatively moved along the planned dividing line 3. In FIG. 8A, regions 44a, 44b, 44c, 44d, and 44e irradiated with the second laser beam 28 are hatched to represent the position of the second laser beam 28 in the undersurface 1b. FIGS. 9A to 9E are plan views schematically illustrating images formed by imaging the reflected light 32 in the imaging step S40. For example, FIG. 9A is a plan view schematically illustrating an image illustrating the reflected light 32 imaged by the imaging unit 34 when the irradiation region 44a in FIG. 8A is irradiated with the second laser beam 28. Similarly, figures from FIG. 9B to FIG. 9E are respectively plan views schematically illustrating images displaying the reflected light 32 imaged by the imaging unit 34 when the irradiation regions 44b, 44c, 44d, and 44e are irradiated with the second laser beam 28.

The traveling paths of the second laser beam 28 and the reflected light 32 traveling within the wafer 1 when the irradiation region 44a is irradiated with the second laser beam 28 are similar to the traveling paths illustrated in FIG. 5B. That is, the second laser beam 28 is reflected by the top surface 1a of the wafer 1 and the crack 9, and the reflected light 32 travels backward in the traveling path of the second laser beam 28 and travels from the undersurface 1b to the outside of the wafer 1. Therefore, in an image 46a illustrated in FIG. 9A, the reflected light 32 appears in a region 48a having a shape similar to the sectional shape of the second laser beam 28.

Figure 8B:
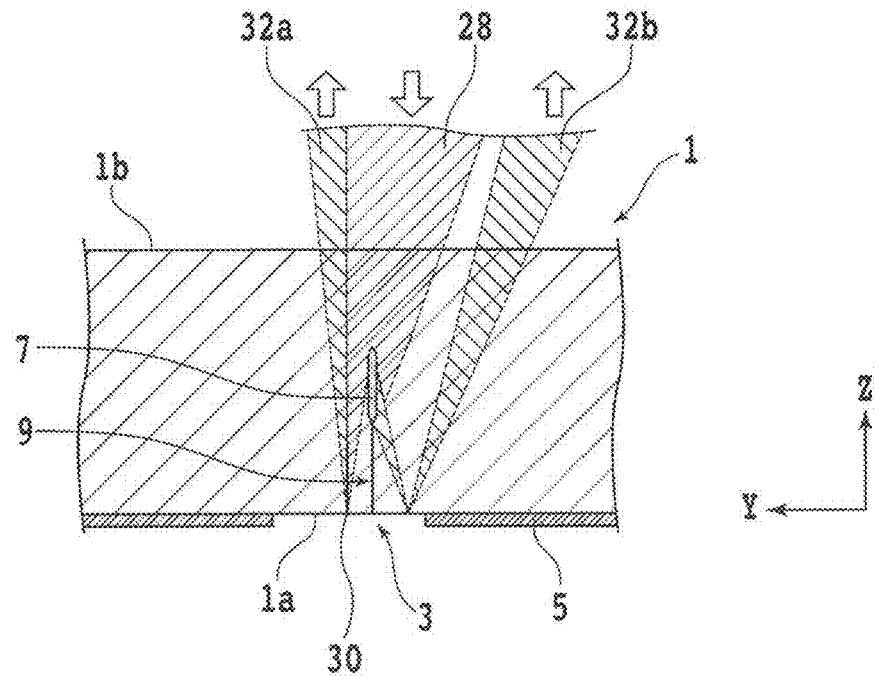
FIG. 8B is a sectional view schematically illustrating paths of the second laser beam and the reflected light.

FIG. 8B illustrates the traveling paths of the second laser beam 28 and reflected light 32a and 32b traveling within the wafer 1 when the irradiation region 44b is irradiated with the second laser beam 28. In this case, a part of the second laser beam 28 traveling within the wafer 1 reaches the condensing point 30 and is reflected by the top surface 1a of the wafer 1. The reflected light 32a travels from the undersurface 1b of the wafer 1 to the outside and reaches the imaging unit 34. Then, in an image 46b schematically illustrated in a plan view of FIG. 9B, the reflected light 32a appears in a region 48b. Meanwhile, as illustrated in FIG. 8B, another part of the second laser beam 28 traveling within the wafer 1 reaches the modified layer 7 and the crack 9, is reflected by the modified layer 7 and the crack 9 and is further reflected by the top surface 1a at a position that is not the condensing point 30. Thereafter, the reflected light 32b travels from the undersurface 1b of the wafer 1 to the outside and reaches the imaging unit 34. Then, in the image 46b schematically illustrated in the plan view of FIG. 9B, the reflected light 32b appears in a region 50b.

Figure 9C:
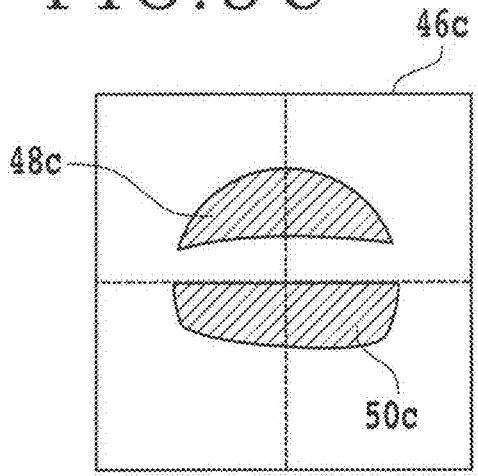
Figure 9D:
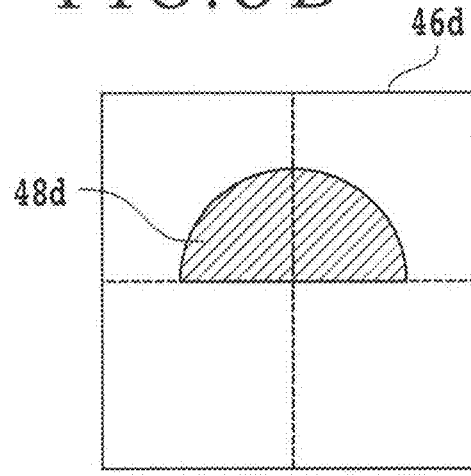
Figure 9E:
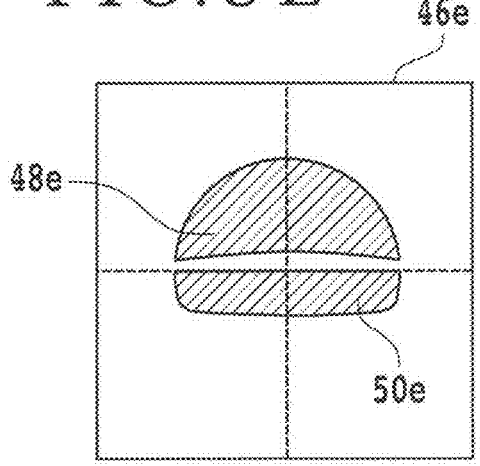

Similarly, in an image 46c schematically illustrated in FIG. 9C, the reflected light not affected by the modified layer 7 appears in a region 48c, and the reflected light affected by the modified layer 7 appears in a region 50c. In an image 46d schematically illustrated in FIG. 9D, the reflected light not affected by the modified layer 7 appears in a region 48d. In an image 46e schematically illustrated in FIG. 9E, the reflected light of a part of the second laser beam 28 reflected at the condensing point 30 is reflected by the modified layer 7 and appears in a region 50e, and remaining reflected light appears in a region 48e without hitting the modified layer 7.

It is to be noted that the changes appearing in the regions illustrating the reflected light 32 according to the processed state of the wafer 1 in the images obtained by imaging the reflected light 32 in the imaging step S40 are not limited to this. That is, changes appear in various modes in the regions illustrating the reflected light in the images according to the thickness of the wafer 1 and the formation depth of the modified layer 7, the position of each constituent element of the observation laser beam irradiating unit 18, and the like. At any rate, however, the positions and shapes of the regions illustrating the reflected light in the images are determined by the processed state of the wafer 1. It is therefore possible to determine the processed state of the wafer 1 from the images obtained in the imaging step S40.

On the basis of the images 46a and 46d, for example, it is suggested that the modified layer 7 is formed at an intended position in the irradiation regions 44a and 44d irradiated with the second laser beam 28. On the other hand, changes in the reflected light appearing in the images 46b, 46c, and 46e are observed, and it is suggested that the modified layer 7 is formed so as to be separated from the intended position in the irradiation regions 44b, 44c, and 44e. It can therefore be determined in the determining step S50 that the modified layer 7 is partially meandered as the processed state of the wafer 1.

Next, description will be made of the determining step S50 in a case where the wafer 1 is irradiated with the second laser beam 28 while the wafer 1 and the condensing point 30 are relatively moved in a direction orthogonal to the direction along the planned dividing line (Y-axis direction) such that the condensing point 30 crosses the modified layer 7.

Figure 10A:
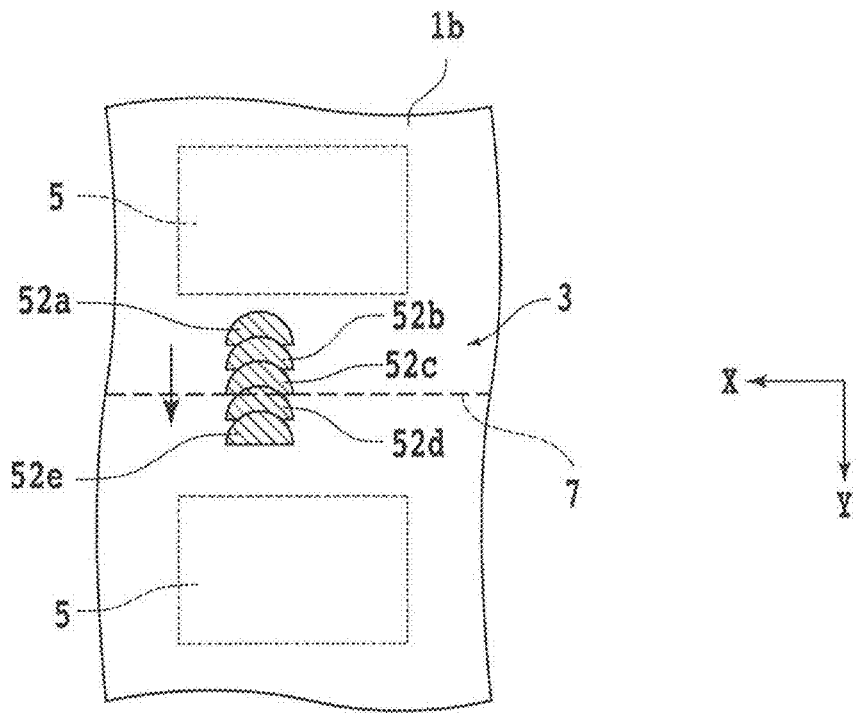
FIG. 10A is a plan view schematically illustrating regions irradiated with the second laser beam.

FIG. 10A is a plan view schematically illustrating regions irradiated with the second laser beam 28 in the undersurface 1b of the wafer 1 in the observation laser beam applying step S30. The modified layer 7 along the planned dividing line 3 is formed within the wafer 1 illustrated in FIG. 10A. The formation position of the modified layer 7 is represented by a broken line in FIG. 10A. In the wafer 1 illustrated in FIG. 10A, however, the crack reaching the top surface 1a from the modified layer 7 is not formed.

In the example illustrated in FIG. 10A, the condensing point 30 is positioned at a position shifted in a Y-axis direction from the modified layer 7 in the top surface 1a, and the undersurface 1b of the wafer 1 is irradiated with the second laser beam 28 five times while the condensing point 30 is relatively moved along the Y-axis direction so as to cross the modified layer 7. In FIG. 10A, regions 52a, 52b, 52c, 52d, and 52e irradiated with the second laser beam 28 are hatched to represent the position of the second laser beam 28 in the undersurface 1b. FIGS. 11A to 11E are plan views schematically illustrating images formed by imaging the reflected light 32 in the imaging step S40.

Figure 11A:
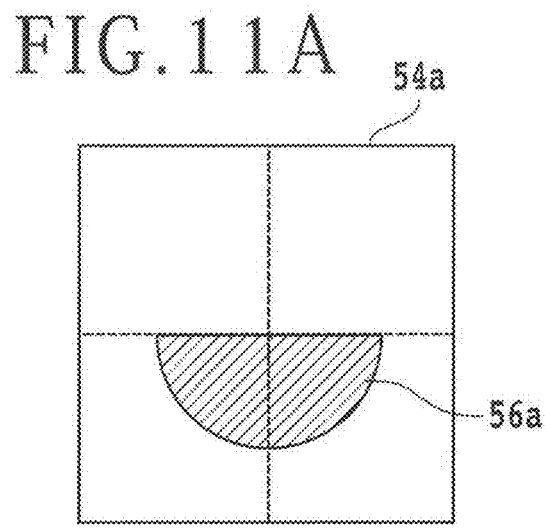
FIG. 11A, FIG. 11B, FIG. 11C, FIG. 11D, and FIG. 11E are plan views schematically illustrating regions illustrating the reflected light in images displaying the reflected light.
Figure 11B:
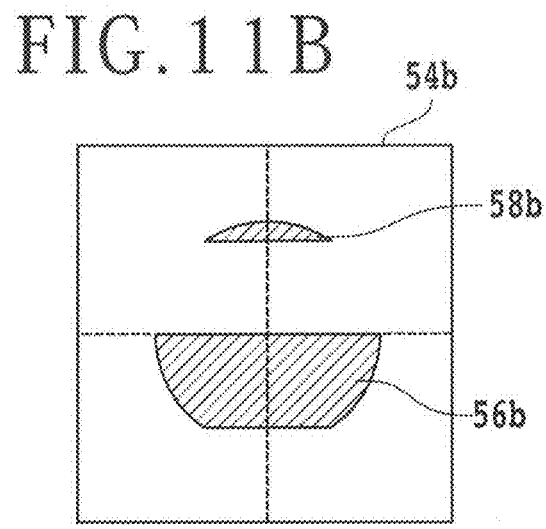
Figure 11C:
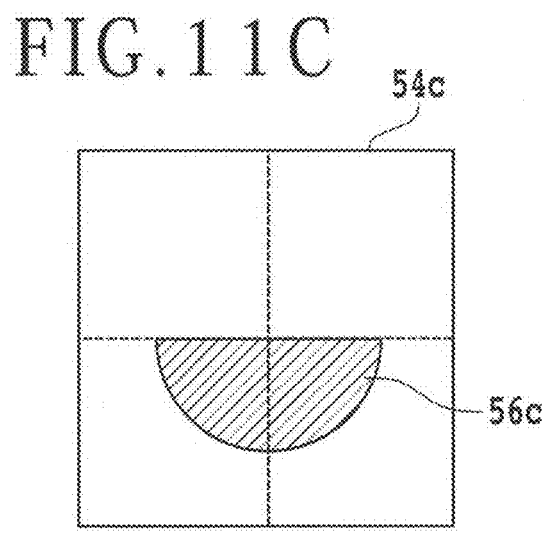
Figure 11D:
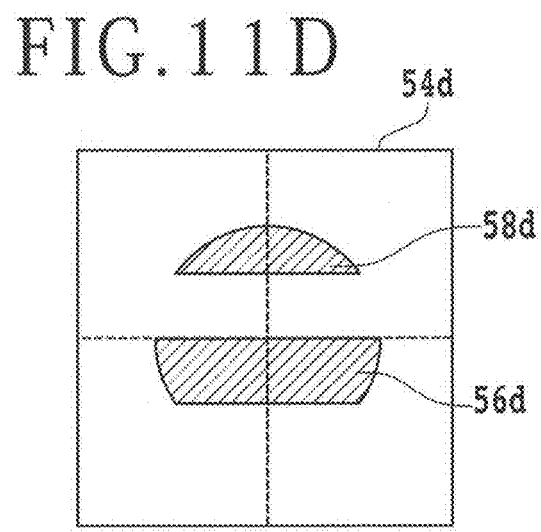
Figure 11E:
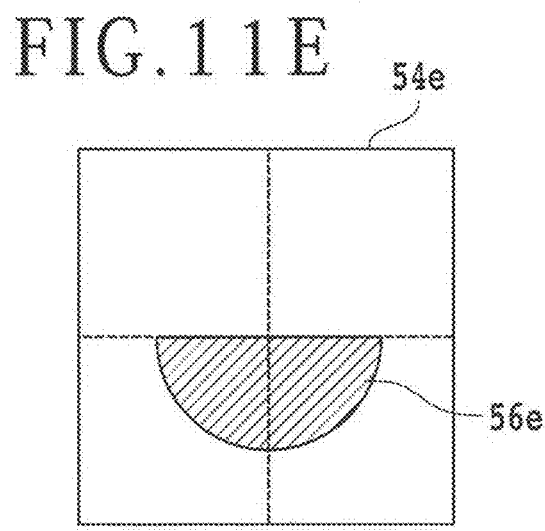

For example, FIG. 11A is a plan view schematically illustrating an image displaying the reflected light 32 which image is formed by the imaging unit 34 when the irradiation region 52a in FIG. 10A is irradiated with the second laser beam 28. Similarly, figures from FIG. 11B to 11E are respectively plan views schematically illustrating images displaying the reflected light 32 which images are formed by the imaging unit 34 when the irradiation regions 52b, 52c, 52d, and 52e are irradiated with the second laser beam 28.

Figure 10B:
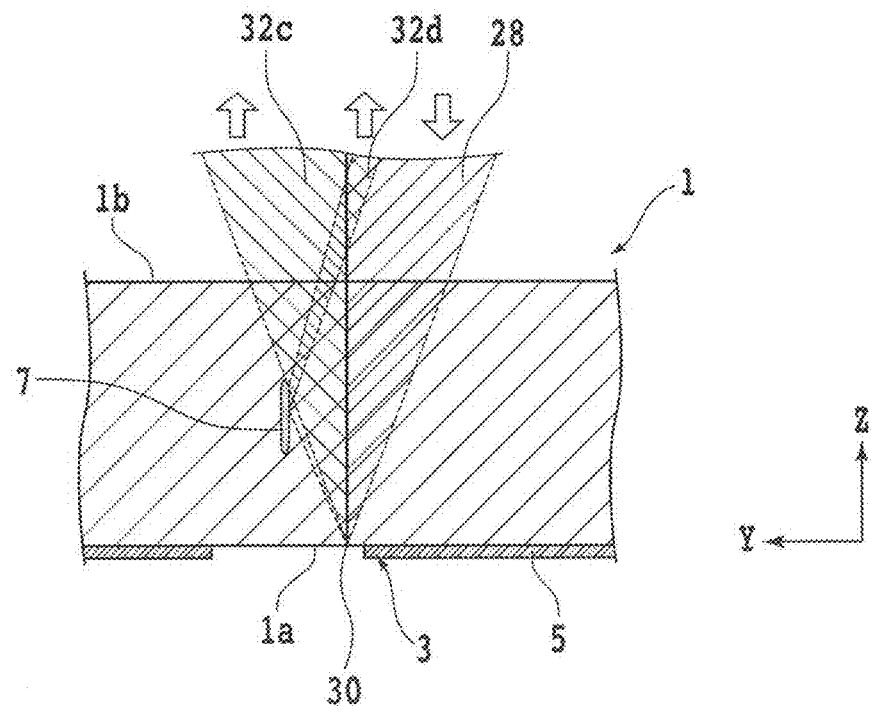
FIG. 10B is a sectional view schematically illustrating paths of the second laser beam and the reflected light.

Because the irradiation region 52a is greatly separated from the modified layer 7, the second laser beam 28 and the reflected light 32 traveling within the wafer 1 do not hit the modified layer 7. That is, the second laser beam 28 is reflected by the top surface 1a of the wafer 1, and the reflected light 32 travels to the outside of the wafer 1. Therefore, in an image 54a illustrated in FIG. 11A, the reflected light 32 appears in a region 56a having a shape obtained by inverting the sectional shape of the second laser beam 28. FIG. 10B schematically illustrates the traveling paths of the second laser beam 28 and reflected light 32c and 32d traveling within the wafer 1 when the irradiation region 52b is irradiated with the second laser beam 28. In this case, the second laser beam 28 traveling within the wafer 1 reaches the condensing point 30 and is reflected by the top surface 1a. Then, a part of the reflected light 32c travels from the undersurface 1b of the wafer 1 to the outside and reaches the imaging unit 34. Then, in an image 54b schematically illustrated in a plan view of FIG. 11B, the reflected light 32c appears in a region 56b. Meanwhile, as illustrated in FIG. 10B, another part of the reflected light 32d reaches the modified layer 7, is reflected by the modified layer 7, travels from the undersurface 1b of the wafer 1 to the outside, and reaches the imaging unit 34. Then, in the image 54b schematically illustrated in the plan view of FIG. 11B, the reflected light 32d appears in a region 58b.

When the irradiation region 52c is irradiated with the second laser beam 28, the second laser beam 28 and the reflected light 32 travel in a traveling path similar to the traveling path illustrated in FIG. 5A. Therefore, in an image 54c schematically illustrated in FIG. 11C, the reflected light 32 appears in a region 56c having a shape obtained by inverting the sectional shape of the second laser beam 28.

When the irradiation region 52d is irradiated with the second laser beam 28, a part of the second laser beam 28 reaches the modified layer 7, is reflected by the modified layer 7, and is reflected by the top surface 1a at a position that is not the condensing point 30. In an image 54d schematically illustrated in FIG. 11D, the reflected light reflected by the top surface 1a at the position that is not the condensing point 30 appears in a region 58d. Further, another part of the second laser beam 28 reaches the condensing point 30 without hitting the modified layer 7, and is reflected by the top surface 1a, and the reflected light appears in a region 56d in an image 54.

When the irradiation region 52e is irradiated with the second laser beam 28, the second laser beam 28 and the reflected light 32 traveling within the wafer 1 do not hit the modified layer 7. That is, the second laser beam 28 is reflected by the top surface 1a of the wafer 1, and the reflected light 32 travels to the outside of the wafer 1. Therefore, in an image 54e illustrated in FIG. 11E, the reflected light 32 appears in a region 56e having a shape obtained by inverting the sectional shape of the second laser beam 28.

Thus, whether or not the second laser beam 28 or the reflected light 32 hits the modified layer 7 can be determined on the basis of the respective images illustrated in FIGS. 11A to 11E. The presence or absence of reflection of the second laser beam 28 or the like by the modified layer 7 changes while the condensing point 30 is moved so as to cross the modified layer 7. It is therefore possible to derive the formation height of the modified layer 7 from information such as the position of the condensing point 30 during a period during which the reflection of the second laser beam 28 or the like by the modified layer 7 is detected, the shape of the second laser beam 28, and the arrangement of the optical system included in the observation laser beam irradiating unit 18. Hence, in the determining step S50, the formation height of the modified layer 7 can be determined as the processed state of the wafer 1. Further, the quality of the modified layer 7 such as a state of unevenness of the reflecting surface of the modified layer 7 as a reflecting surface may be determined from the distribution of the reflected light 32 in an image displaying the reflected light 32.

In addition, the position of the modified layer 7 in the Y-axis direction can also be determined precisely on the basis of each image. When the position of the modified layer 7 can be determined precisely, the second laser beam 28 can be applied with the condensing point 30 positioned so as to be superposed on the modified layer 7. For example, when the second laser beam 28 is applied with the condensing point 30 precisely positioned at a position superposed on the modified layer 7 in the top surface 1a of the wafer 1, and an image displaying the reflected light 32 is formed, the presence or absence of the crack 9 extending from the modified layer 7 to the top surface 1a can be determined with high accuracy (see FIG. 5A and FIG. 5B). As described above, in the determining step S50, the processed state of the wafer 1 is determined on the basis of the images displaying the reflected light 32 of the second laser beam 28.

Here, the observation laser beam applying step S30, the imaging step S40, and the determining step S50 may be performed repeatedly. For example, first, the observation laser beam applying step S30 is performed while the condensing point 30 is moved along the Y-axis direction so as to cross the modified layer 7. Then, the position of the modified layer 7 in the Y-axis direction can be identified in the determining step S50. Thereafter, the condensing point 30 is positioned so as to be superposed on the modified layer 7, and the observation laser beam applying step S30 is performed while the condensing point 30 is moved along the X-axis direction. Then, whether or not the modified layer 7 is meandered can be determined in the determining step S50.

It is to be noted that the shape and position of the reflected light 32 appearing in the images obtained in the imaging step S40 are not limited to this. For example, in the case where the crack 9 is not formed in the wafer 1, the reflected light 32 displayed in the images may not have the shape obtained by inverting the sectional shape of the incident light depending on the condensing position of the second laser beam 28 and the disposition position of the imaging unit 34. That is, effects of the processed state of the wafer 1 on the position and shape of the reflected light 32 appearing in the images differ according to each system. Accordingly, the effects are preferably verified in advance in the case where the processed state of the wafer 1, the processed state being typified by the presence or absence of the crack 9 extending from the modified layer 7 to the top surface 1a, is to be determined from the images obtained in the imaging step S40.

For example, a wafer 1 in which the crack 9 is formed in advance and a wafer 1 in which the crack 9 is not formed are prepared, each of the wafers 1 is irradiated with the second laser beam 28, and images are obtained by similarly imaging the reflected light 32. In addition, a wafer 1 in which the formation position and formation depth of the modified layer 7 are known is prepared, the wafer 1 is irradiated with the second laser beam 28 while the condensing point 30 is variously moved with respect to the modified layer 7, and images are obtained by similarly imaging the reflected light 32. Then, effects of the presence or absence of the crack 9 and the formation depth and formation position of the modified layer 7 on the images and the like are evaluated multilaterally. That is, it is preferable to evaluate the effects of the processed state of the wafer 1 on the images and create a criterion for determining the processed state of the wafer 1 from the images.

Incidentally, when the modified layer 7 is formed in the wafer 1, the modified layer 7 in a linear shape may be formed at a position separated from a center line of the planned dividing line 3 even in a case where the modified layer 7 is formed without meandering. A distance between the formation position of the modified layer 7 and the center line of the planned dividing line 3 is referred to as a kerf displacement. The wafer processing method according to the present embodiment may evaluate an amount of kerf displacement by determining the formation position of the modified layer 7. In addition, when the modified layer 7 is formed in the wafer 1, a crack 9 not reaching the top surface 1a may extend from the modified layer 7. When wafers 1 in which the length of the crack 9 extending from the modified layer 7 is known are prepared, and images displaying the reflected light 32 are similarly formed, a relation between the length of the crack 9 and the positions and shapes of regions illustrating the reflected light 32 in the images may be obtained. In this case, in the determining step S50, the length of the crack 9 can be calculated from the images displaying the reflected light 32.

Further, the wafer processing method according to the present embodiment obtains information about a position at which a processing abnormality is caused in the wafer 1 by irradiating the undersurface 1b side of the wafer 1 with the second laser beam 28 while moving the condensing point 30 and obtaining a plurality of images displaying the reflected light 32. Accordingly, the wafer processing method according to the present embodiment may store the information about the position at which the processing abnormality is caused in a control unit of the laser processing apparatus 2 or the like. In this case, for example, on the basis of the information about the position at which the processing abnormality is caused, device chips obtained from the position at which the processing abnormality is caused can be identified as defective products among the individual device chips obtained by dividing the wafer 1. In addition, an operator of the laser processing apparatus 2 can adjust or repair constituent elements of the laser processing apparatus 2 on the basis of the information about the position at which the processing abnormality is caused in the wafer 1.

As described above, in the wafer processing method according to the present embodiment, the presence or absence of the crack 9 can be easily determined on the spot without the wafer 1 being moved from the chuck table 4 of the laser processing apparatus 2. That is, the processed state of the wafer 1 can be determined easily.

It is to be noted that the present invention is not limited to the description of the foregoing embodiment but can be modified and carried out in various manners. For example, while in the foregoing embodiment, description has been made mainly of a case where the wafer 1 is irradiated with the first laser beam 14 and the second laser beam 28 from the undersurface 1b side, one aspect of the present invention is not limited to this. For example, the first laser beam 14 and the second laser beam 28 may be applied to the top surface 1a side of the wafer 1. In addition, a wafer 1 on which the devices 5 are not formed may be laser-processed to form the modified layer 7 within the wafer 1. In addition, while in the foregoing embodiment, description has been made by taking as an example a case where the sectional shape of the second laser beam 28 is a semicircular shape, the sectional shape is not limited to this. For example, the sectional shape may be a triangular shape, a quadrangular shape, or another polygonal shape. That is, it suffices for the distribution of power to be asymmetric with respect to the axis along the planned dividing line 3 (for example, the modified layer 7).

Incidentally, there is a case where the second laser beam 28 applied to the wafer 1 is not precisely condensed to the condensing point 16 due to an effect of spherical aberration, and consequently the reflected light 32 is not clearly displayed in the images obtained in the imaging step S40. Accordingly, the condensing lens 24 may be fitted with a correction ring that alleviates the effect of spherical aberration. In this case, for example, a correction ring having appropriate performance according to the thickness and material of the wafer 1 is selected and used. Alternatively, in a case where a spatial light modulator such as an LCOS element is used in the observation laser beam irradiating unit 18, the second laser beam 28 corrected for spherical aberration may be formed and applied to the undersurface 1b of the wafer 1.

Further, the observation laser beam applying step S30 may be performed in an immersed state. Describing the observation laser beam applying step S30 illustrated in FIG. 4 in this case, a space between the condensing lens 24 and the undersurface 1b of the wafer 1 is filled with a liquid. A liquid referred to as an immersion oil, glycerin, or pure water, for example, can be used as the liquid. In a case where the observation laser beam applying step S30 is performed in an immersed state, the numerical aperture of the condensing lens 24 functioning as an objective lens can be increased. Therefore, the resolution of images displaying the reflected light 32 imaged by the imaging unit 34 can be enhanced, so that the processed state of the wafer 1 can be analyzed in more detail.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for forming a modified layer within a wafer along a plurality of planned dividing lines of the wafer, the wafer having the planned dividing lines set on a top surface of the wafer, the wafer processing method comprising:
   a holding step of making the top surface of the wafer face a chuck table, and holding the wafer by the chuck table;
   a modified layer forming step of forming the modified layer within the wafer by positioning a condensing point of a first laser beam having a wavelength transmissible through the wafer within the wafer and applying the first laser beam along the planned dividing lines from an undersurface side of the wafer while moving a laser beam irradiating unit and the chuck table relative to each other in a direction along the planned dividing lines;
   an observation laser beam applying step of, after the modified layer forming step, positioning a condensing point of a second laser beam having a power not exceeding a processing threshold value of the wafer and having a wavelength transmissible through the wafer within the wafer or at the top surface of the wafer, and applying the second laser beam from the undersurface side of the wafer while moving the wafer and the condensing point relative to each other in the direction along the planned dividing lines;
   an imaging step of imaging, by an imaging unit, reflected light of the second laser beam applied in the observation laser beam applying step; and
   a determining step of determining a processed state of the wafer on a basis of an image photographed in the imaging step,
   wherein the second laser beam applied to the wafer in the observation laser beam applying step is formed such that a sectional shape of the second laser beam as applied upon the undersurface side of the wafer is not axisymmetric with respect to an axis along the planned dividing lines.

2. The wafer processing method according to claim 1, wherein the observation laser beam applying step is performed in an immersed state in which a space between a condensing lens and the undersurface side of the wafer is filled with a liquid.

3. The wafer processing method according to claim 2, wherein the liquid comprises an immersion oil.

4. The wafer processing method according to claim 2, wherein the liquid comprises glycerin.

5. The wafer processing method according to claim 2, wherein the liquid comprises water.

6. The wafer processing method according to claim 1, wherein the sectional shape of the second laser beam upon the undersurface side of the wafer is a semicircular shape.

7. A wafer processing method for forming a modified layer within a wafer along a plurality of planned dividing lines of the wafer, the wafer having the planned dividing lines set on a top surface of the wafer, the wafer processing method comprising:
   a holding step of making the top surface of the wafer face a chuck table, and holding the wafer by the chuck table;
   a modified layer forming step of forming the modified layer within the wafer by positioning a condensing point of a first laser beam having a wavelength transmissible through the wafer within the wafer and applying the first laser beam along the planned dividing lines from an undersurface side of the wafer while moving a laser beam irradiating unit and the chuck table relative to each other in a direction along the planned dividing lines;
   an observation laser beam applying step of, after the modified layer forming step, positioning a condensing point of a second laser beam having a power not exceeding a processing threshold value of the wafer and having a wavelength transmissible through the wafer within the wafer or at the top surface of the wafer, and applying the second laser beam from the undersurface side of the wafer while moving the wafer and the condensing point relative to each other in a direction orthogonal to the direction along the planned dividing lines such that the condensing point crosses the modified layer;
   an imaging step of imaging, by an imaging unit, reflected light of the second laser beam applied in the observation laser beam applying step; and
   a determining step of determining a processed state of the wafer on a basis of an image photographed in the imaging step,
   wherein the second laser beam applied to the wafer in the observation laser beam applying step is formed such that a sectional shape of the second laser beam as applied upon the undersurface side of the wafer is not axisymmetric with respect to an axis along the planned dividing lines.

8. The wafer processing method according to claim 7, wherein the observation laser beam applying step is performed in an immersed state in which a space between a condensing lens and the undersurface side of the wafer is filled with a liquid.

9. The wafer processing method according to claim 8, wherein the liquid comprises an immersion oil.

10. The wafer processing method according to claim 8, wherein the liquid comprises glycerin.

11. The wafer processing method according to claim 8, wherein the liquid comprises water.

12. The wafer processing method according to claim 7, wherein the sectional shape of the second laser beam upon the undersurface side of the wafer is a semicircular shape.

* * * * *